(12) United States Patent
Chiu et al.

(10) Patent No.: US 11,381,215 B2
(45) Date of Patent: Jul. 5, 2022

(54) WIRELESS COMMUNICATION DEVICE

(71) Applicant: ASUSTeK COMPUTER INC., Taipei (TW)

(72) Inventors: Pin-Tang Chiu, Taipei (TW); Chia-Ho Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 282 days.

(21) Appl. No.: 16/417,852

(22) Filed: May 21, 2019

(65) Prior Publication Data

US 2019/0372546 A1 Dec. 5, 2019

(51) Int. Cl.
*H01Q 1/24* (2006.01)
*H03H 7/40* (2006.01)
*H04M 1/02* (2006.01)
*G06F 3/02* (2006.01)
*H01Q 5/335* (2015.01)

(52) U.S. Cl.
CPC ............ *H03H 7/40* (2013.01); *G06F 3/02* (2013.01); *H01Q 1/245* (2013.01); *H01Q 5/335* (2015.01); *H04M 1/0277* (2013.01)

(58) Field of Classification Search
CPC .......... H03H 7/40; H04M 1/0277; G06F 3/02; H01Q 5/335; H01Q 1/245; H01Q 1/38; H01Q 9/42
See application file for complete search history.

(56) References Cited

U.S. PATENT DOCUMENTS

2014/0203980 A1\* 7/2014 Mahanfar ............. H01Q 1/245
343/745
2018/0069295 A1\* 3/2018 Han ...................... H01Q 1/245

FOREIGN PATENT DOCUMENTS

| CN | 202663462 U | | 1/2013 |
|---|---|---|---|
| CN | 103165982 A | \* | 6/2013 |
| CN | 103165982 A | | 6/2013 |
| CN | 203071924 U | \* | 7/2013 |
| CN | 203071924 U | | 7/2013 |
| CN | 203563060 U | | 4/2014 |
| CN | 103872426 A | | 6/2014 |
| CN | 105071024 A | | 11/2015 |

\* cited by examiner

*Primary Examiner* — Alexander H Taningco
*Assistant Examiner* — Amy X Yang
(74) *Attorney, Agent, or Firm* — McClure, Qualey & Rodack, LLP (57) ABSTRACT

A wireless communication device is provided. The wireless communication device comprises a circuit board, a key module and a sensing module. The key module is electrically connected with at least one key through the circuit board. The sensing module is electrically connected with the circuit board, wherein the circuit board is taken as an induction conductor of the sensing module. Therefore, according to the wireless communication device disclosed by the disclosure, the functions of the key module, the sensing module and an antenna module are integrated on a same component, so that the component has three-in-one functions, and the efficiency of an antenna is further enhanced.

9 Claims, 10 Drawing Sheets

WIRELESS COMMUNICATION DEVICE

CROSS-REFERENCE TO RELATED APPLICATION

This application claims the priority benefit of Chinese Application Serial No. 201820810026.6, filed on May 29, 2018. The entirety of the above-mentioned patent application is hereby incorporated by reference herein and made a part of specification.

BACKGROUND OF THE INVENTION

Field of the Invention

The disclosure relates to a wireless communication device and particularly relates to the arrangements of keys, inductors and antennas in the wireless communication device.

Description of the Related Art

With the popularity of a wireless communication device, people have more requirements for more modern appearance and high efficiency of the wireless communication device, such as a bigger display area with a narrower frame and increasing of a frequency ratio.

However, the narrow frame of the wireless communication device brings some impacts. For example, the space for arrange antennas is limited, and bad antenna arrangements reduce the communication quality of the antennas. In addition, concerning about the safety use of electromagnetic waves, an electromagnetic wave inductor is arranged in the wireless communication device to instantly induce the electromagnetic waves and adjust the electromagnetic wave energy for emitting the electromagnetic waves. However, the inductor placed near the antenna also occupies the limited space for antennas.

BRIEF SUMMARY OF THE INVENTION

The disclosure is directed to a wireless communication device.

According to an aspect of the disclosure, a wireless communication device is provided herein. The wireless communication device comprises: a circuit board; a key module, electrically connected with at least one key through the circuit board; and an sensing module, electrically connected with the circuit board, wherein the circuit board is taken as an induction conductor of the sensing module.

The wireless communication device disclosed by the disclosure has the following beneficial effects: the functions of the key module, the sensing module and the antenna module are integrated on the same component, so that the single component has three-in-one functions, and the efficiency of the antenna is further enhanced.

BRIEF DESCRIPTION OF THE DRAWINGS

To make the foregoing and other objectives, features, advantages, and embodiments of the invention more comprehensible, descriptions of the accompanying drawings are as follows.

DETAILED DESCRIPTION OF THE EMBODIMENTS

To make the description of the invention more thorough and complete, reference may be made to the accompanying drawings and the various embodiments described below. On the other hand, well-known components are not described in the embodiments to avoid unnecessarily limiting the invention.

As used in the following embodiments, "coupled" or "connected" may mean that two or more components are in "direct physical" or electrical contact with each other or are in "indirect" physical or electrical contact with each other, and may also mean that two or more components interact with each other.

As used herein, "a" and "the" may broadly mean one or more than one unless otherwise particularly defined. It will be further understood that as used herein, the terms such as "comprise" and "include" specify the stated features, regions, integers, steps, operations, elements, and/or components thereof, but do not preclude the presence or addition of one or more other features, regions, integers, steps, operations, elements, components, and/or groups thereof.

Figure 1:
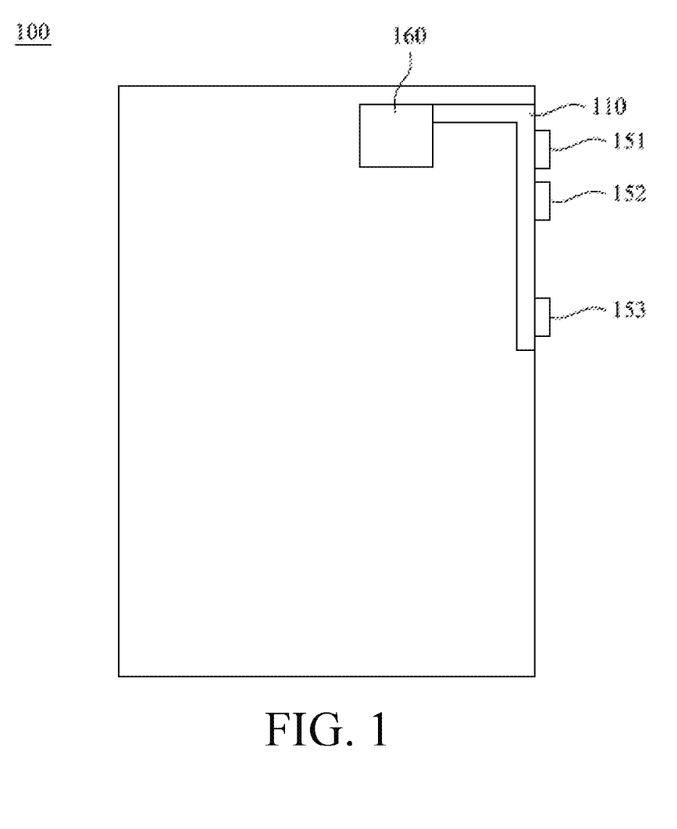
FIG. 1 is a schematic diagram of a wireless communication device according to an embodiment of the disclosure.

FIG. 1 is a schematic diagram of a wireless communication device 100 according to an embodiment of the disclosure. In an embodiment, the wireless communication device 100 is a mobile phone or any electronic device that requires narrowing of a frame and wants to increase the induction sensitivity, which is not limited herein.

As shown in FIG. 1, in some embodiments, the wireless communication device 100 comprises keys 151, 152, 153, a circuit board 110 and a circuit 160, wherein the circuit board 110 is electrically connected with the keys 151, 152, 153 and the circuit 160.

In some embodiments, the keys 151, 152, 153 are disposed on a surface of the wireless communication device 100, or the keys 151, 152, 153 are disposed in any positions of the wireless communication device 100. In some embodiments, the keys 151, 152 and 153 are for adjusting volume or power keys. When any one of the keys 151, 152 and 153 is pressed, the pressed key 151, 152 or 153 is conducted with the circuit board 110 to transmit a signal to the circuit 160.

In some embodiments, the circuit board 110 is an FPC (Flexible Print Circuit), and the circuit board 110 comprises a first side surface and a second side surface opposite to the first side surface, wherein the first side surface comprises a routing, the second side surface of the circuit board 110 comprises copper, or the second side surface is made of any metal material. In some embodiments, the first side surface is connected with the second side surface. In other embodiments, an insulating layer is formed between the first side surface and the second side surface, so that the routing of the first side surface does not affect the voltage of the second side surface.

Figure 2:
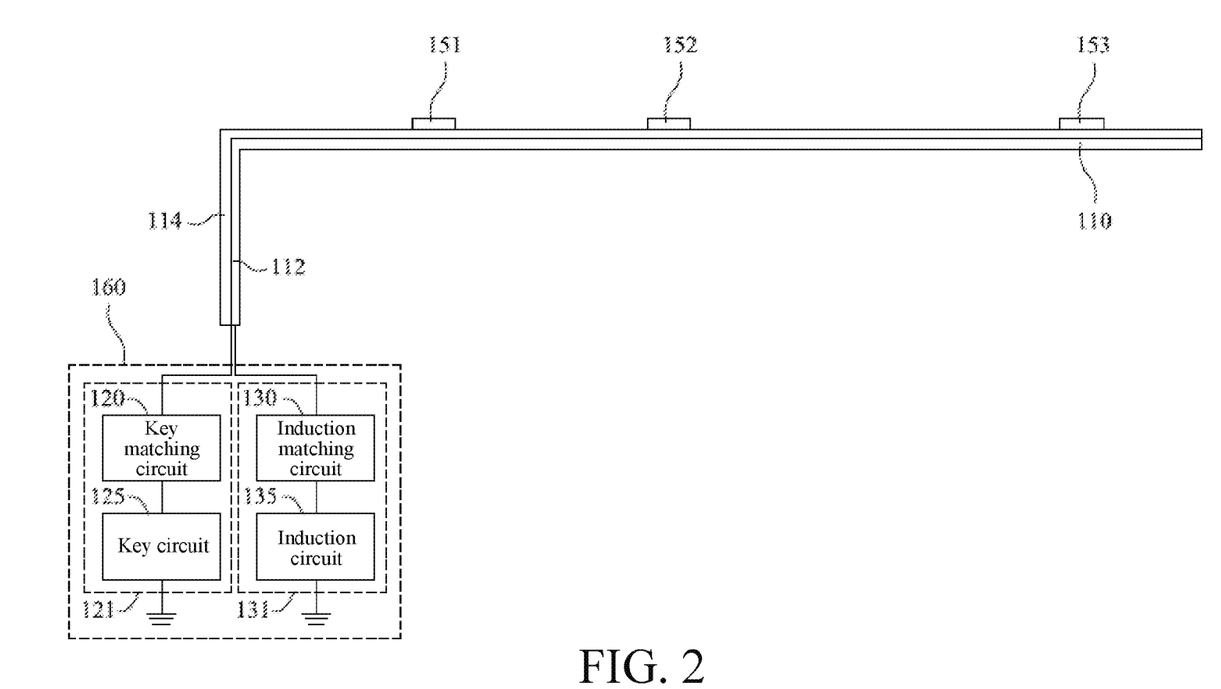
FIG. 2 is a schematic diagram of the edge of the wireless communication device in FIG. 1 according to the embodiment of the disclosure.

In some embodiments, the circuit 160 comprises a circuit related to the key 151, 152, 153 and a circuit related to the sensing module, the detailed circuit layout is illustrated in FIG. 2, and the descriptions thereof are omitted herein.

FIG. 2 is a schematic diagram of the edge of the wireless communication device 100 in FIG. 1 according to the embodiment of the disclosure. In some embodiments, the circuit 160 comprises a key module 121 and a sensing module 131, wherein one end of the key module 121 is electrically connected with a routing 112 on the circuit board 110 through a connector (not shown), the other end of the key module 121 is grounded, one end of the sensing module 131 is electrically connected with a metal conductor 114 on the circuit board 110, and the other end of the sensing module 131 is grounded. In some embodiments, the routing 112 and the metal conductor 114 are respectively disposed on the first side surface and the second side surface of the circuit board 110, and the isolating layer is disposed between the routing 112 and the metal conductor 114 to enhance the isolation degree between the routing 112 and the metal conductor 114. In some other embodiments, the routing 112 and the metal conductor 114 are disposed on the same side surface of the circuit board 110, and the isolating layer is disposed between the routing 112 and the metal conductor 114.

In detail, the circuit board 110 is taken as a signal transmission channel of the key module 121 and simultaneously is taken as an induction conductor of the sensing module 131.

In some embodiments, when one of the keys 151, 152 or 153 is pressed, a corresponding control signal is triggered to control the wireless communication device 100 to generate a corresponding function. In an embodiment, when the key 151 is pressed, the current is transmitted to the key module 121 through the circuit board 110, and the key module 121 generates a control signal to turn up the volume of the wireless communication device 100. When the key 152 is pressed, the current is transmitted to the key module 121 through the circuit board 110, and the key module 121 generates a control signal to turn down the volume of the wireless communication device 100. In an embodiment, when the key 153 is pressed, the current is transmitted to the key module 121 through the circuit board 110, and the key module 121 generates a corresponding control signal to turn on or off the power supply of the wireless communication device 100.

As shown in FIG. 2, in some embodiments, the key module 121 comprises a key matching circuit 120 and a key circuit 125, wherein one end of the key matching circuit 120 is electrically connected with the routing 112 on the circuit board 110, the other end of the key matching circuit 120 is electrically connected with one end of the key circuit 125, and the other end of the key circuit 125 is grounded.

In some embodiments, the key matching circuit 120 matches the output currents from at least one of the key 151, 152 or 153 with the input current from the key circuit 125. In an embodiment, the key matching circuit 120 filters out unstable parts of the currents from at least one of the key 151, 152 or 153 and output the filtered currents to the key circuit 125. In an embodiment, the key matching circuit 120 is achieved by a resistance-capacitance (RC) filter circuit or an inductance filter circuit. Any matching filter that configured to adjust the impedance of the key circuit 125 is within the protection scope of the disclosure.

In some embodiments, the key circuit 125 processes the current from the key matching circuit 120 so as to control the wireless communication device 100 to generate a corresponding function.

In some embodiments, the sensing module 131 calculates the capacitance value between the sensed object (not shown) and the wireless communication device 100 and changes the radiation power of the wireless communication device 100 according to the calculated capacitance value. In practical application, the sensing module 131 is a contact type capacitance inductor or a non-contact type capacitance inductor. In detail, when the sensing module 131 is a contact type capacitance inductor, the sensing module 131 contacts the circuit board 110 through the induced object (not shown) to cause the variation of the capacitance value between the circuit board 110 and the ground, thereby determining that the sensed object (not shown) contacts with the wireless communication device 100. In an embodiment, when the sensing module 131 is a non-contact type capacitance inductor and a coupling effect is generated while the sensed object (not shown) is close to the circuit board 110, the coupling capacitance value between the circuit board 110 and the ground is changed to change the oscillation frequency of an oscillator (not shown). In an embodiment, when the conductor is close to the wireless communication device 100, the oscillation amplitude of the oscillator (not shown) gradually increases, and one power control signal is generated to reduce the electromagnetic wave power generated by the wireless communication device 100; and when the conductor is away from the wireless communication device 100, the oscillation amplitude of the oscillator (not shown) gradually decreases, and another power control signal is generated to increase the electromagnetic wave power generated by the wireless communication device 100.

Then, the sensing module 131 determines the distance between the sensed object (not shown) and the wireless communication device 100. In some embodiments, the sensing module 131 calculates the distance between the induced object (not shown) and the wireless communication device 100 by taking the circuit board 110 as a conductor, thereby reducing the radiation power of the wireless communication device 100 according to the distance. In some other embodiments, the sensing module 131 determines whether the sensed object (not shown) is a human body or not according to the variation of the frequency of the calculated distance. When the sensing module 131 determines that the sensed object (not shown) is not the human body, the radiation power of the wireless communication device 100 is increased again. In detail, when the frequency of the distance changes very fast (that is, the variation of the frequency of the capacitance value between the circuit board 110 and the ground terminal is very high), the sensing module 131 determines that the sensed object (not shown) is the human body, and the radiation power of the wireless communication device 100 is reduced.

As shown in FIG. 2, in some embodiments, the sensing module 131 comprises an induction matching circuit 130 and an induction circuit 135, wherein one end of the induction matching circuit 130 is electrically connected with the metal conductor on the circuit board 110, the other end of the induction matching circuit 130 is electrically connected with one end of the induction circuit 135, and the other end of the induction circuit 135 is grounded.

In some embodiments, the induction matching circuit 130 filters the noise of the capacitance value between the circuit board 110 and the ground to increase the sensitivity of the sensing module 131.

In some embodiments, the induction circuit 135 calculates the distance between the sensed object (not shown) and the wireless communication device 100 according to the capacitance value has been processed by the induction matching circuit 130 so as to change the radiation power of the wireless communication device 100.

Figure 3:
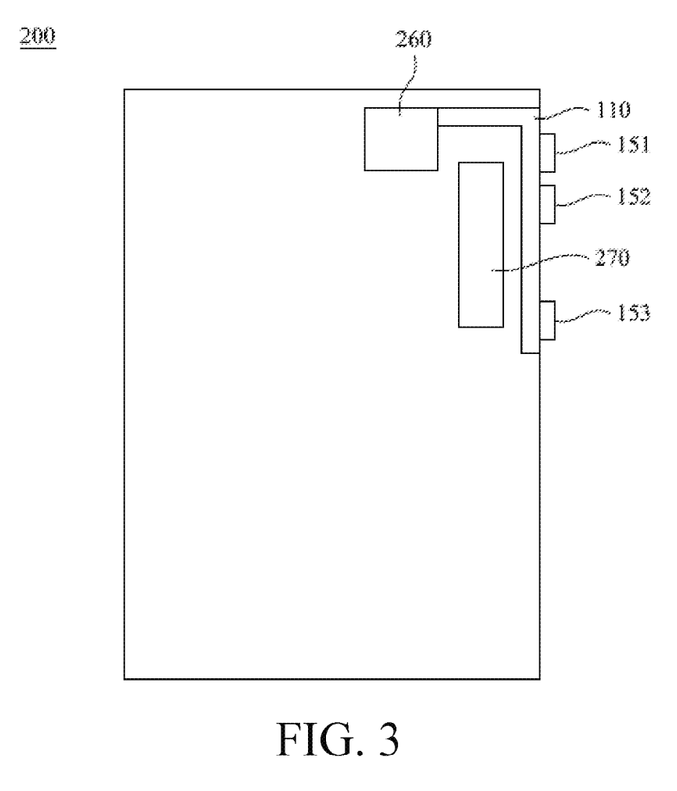
FIG. 3 is a schematic diagram of a wireless communication device according to an embodiment of the disclosure.
Figure 6:
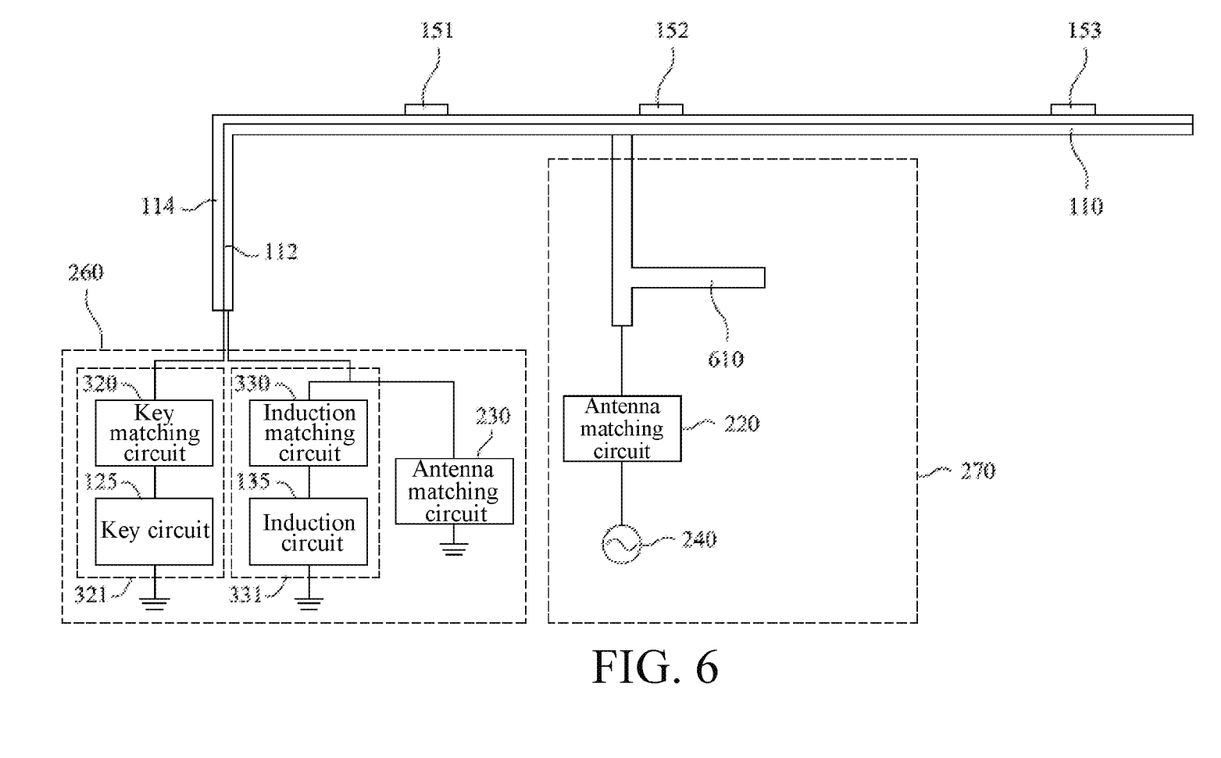
FIG. 6 is a schematic diagram of the edge of the wireless communication device in FIG. 3 according to the embodiment of the disclosure.
Figure 7:
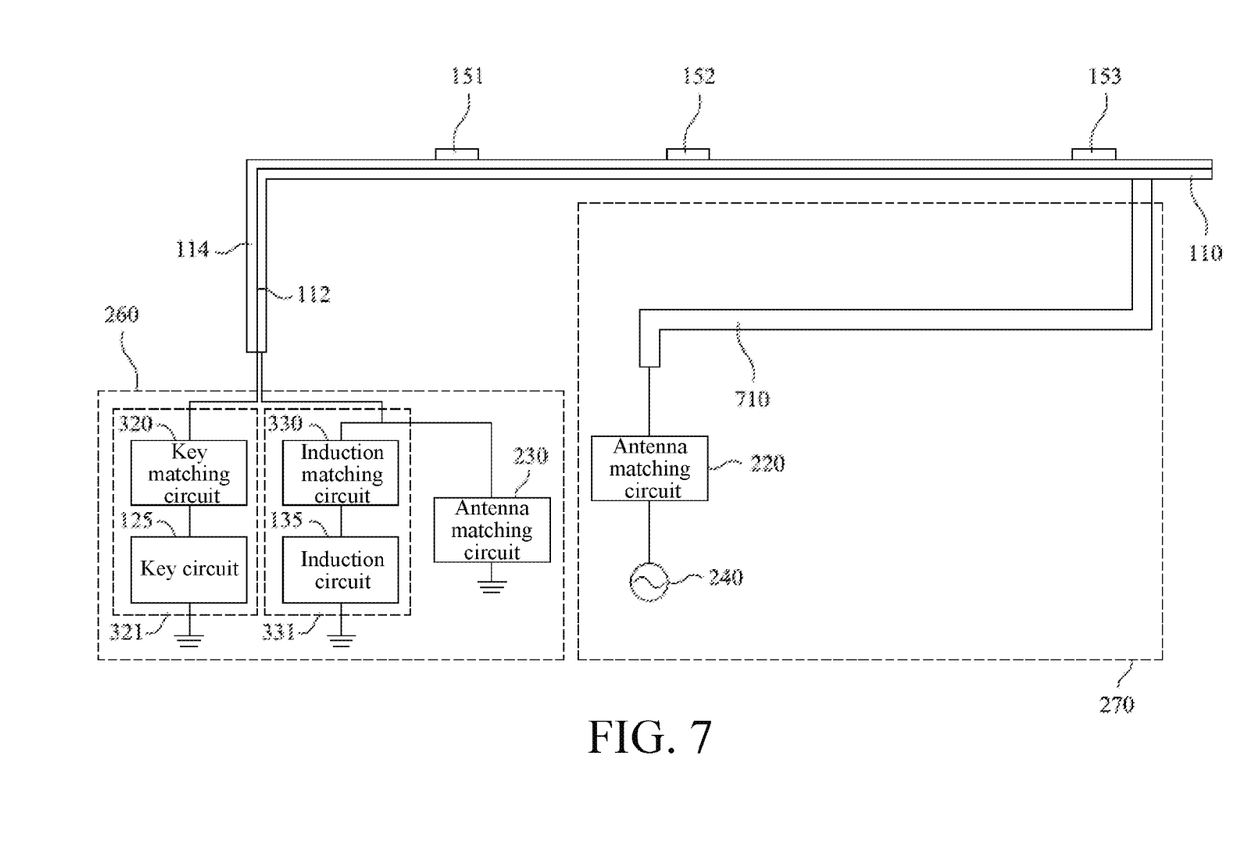
FIG. 7 is a schematic diagram of the edge of the wireless communication device in FIG. 3 according to the embodiment of the disclosure.

FIG. 3 is a schematic diagram of a wireless communication device 200 according to an embodiment of the disclosure. As shown in FIG. 3, the wireless communication device 200 comprises keys 151, 152, 153, a circuit board 110, a circuit 260 and an antenna module 270. The functions of the keys 151, 152, 153 are identical to that as shown in FIG. 1 and are omitted herein. The circuit 260 and the antenna module 270 are configured as shown in FIG. 4, FIG. 6 and FIG. 7, and FIG. 4, FIG. 6 and FIG. 7 are taken as examples for detailed description.

As shown in FIG. 3, the antenna module 270 is disposed at the inner sides of the keys 151, 152 and 153. In some embodiments, the antenna module 270 is operated together with the circuit board 110 and receives or transmits wireless signals according to the operation frequency. In an embodiment, the operation frequency is 700 MHz, 900 MHz or 1800 MHz, which is not limited in the disclosure.

Figure 4:
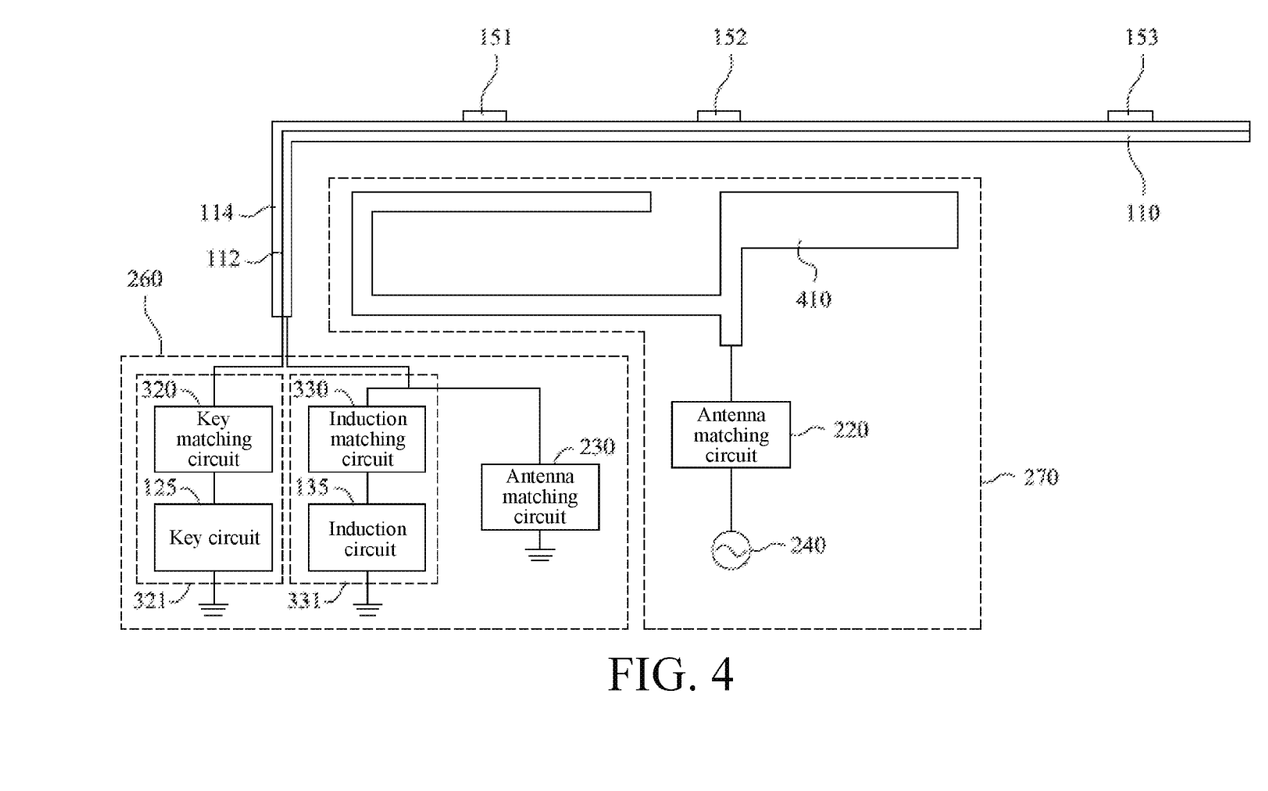
FIG. 4 is a schematic diagram of the edge of the wireless communication device in FIG. 3 according to the embodiment of the disclosure.
Figure 5A:
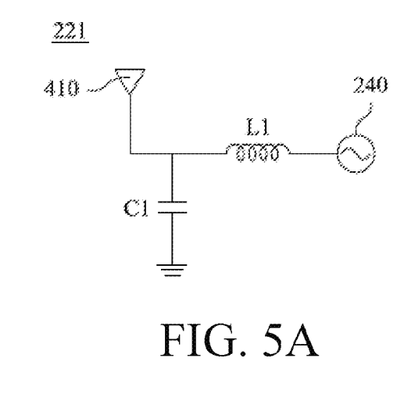
FIG. 5A, FIG. 5B, FIG. 5C and FIG. 5D are schematic diagrams of antenna matching circuits in FIG. 4 according to the embodiment of the disclosure.
Figure 5B:
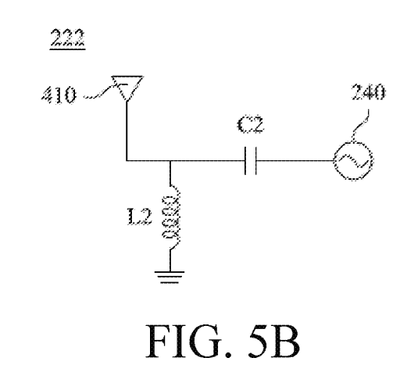
Figure 5C:
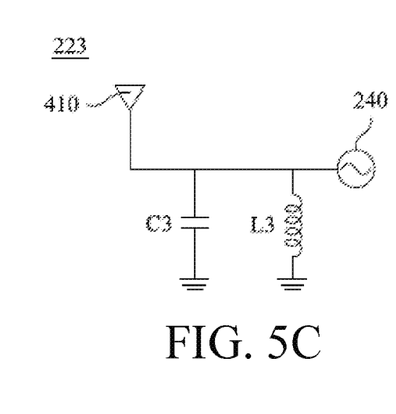
Figure 5D:
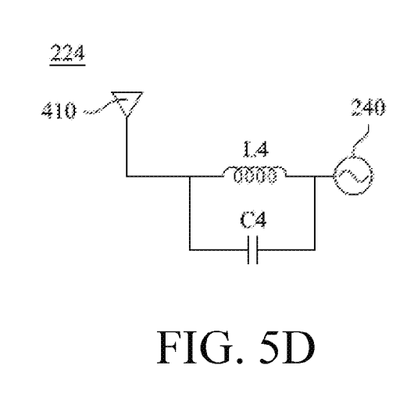

FIG. 4 is a schematic diagram of the edge of the wireless communication device 200 in FIG. 3 according to the embodiment of the disclosure. As shown in FIG. 4, in some embodiments, the wireless communication device 200 comprises keys 151, 152, 153, a circuit board 110, a circuit 260 and an antenna module 270, wherein the circuit 260 comprises a key module 321, a sensing module 331 and a second antenna matching circuit 230. In some embodiments, one end of the key module 321 is electrically connected with the routing 112 on the circuit board 110, and the other end of the key module 321 is grounded; one end of the sensing module 131 is electrically connected to a metal conductor 114 on the circuit board 110, and the other end of the sensing module 131 is grounded; and one end of the second antenna matching circuit 230 is electrically connected with the metal conductor 114 on the circuit board 110, and the other end of the second antenna matching circuit 230 is grounded, wherein the metal conductor 114 and the second antenna matching circuit 230 are cooperatively operated to form an equivalent antenna coupled with the antenna module 270.

In detail, in some embodiments, the routing 112 on the circuit board 110 is taken as a signal transmission channel of the key module 321, and the metal conductor 114 on the circuit board 110 is taken as an induction conductor of the sensing module 331.

In some embodiments, the second antenna matching circuit 230 selects a proper filter to calibrate the resonant frequency of the circuit board 110, thereby optimizing the efficiency of the circuit board 110.

In some embodiments, the key module 321 further comprises a key matching circuit 320 besides the key circuit 125 in the key module 121 in FIG. 2. The sensing module 331 further comprises an induction matching circuit 330 besides the induction circuit 135 in the sensing module 131 in FIG. 2. As shown in FIG. 4, one end of the key matching circuit 320 is electrically connected with the routing 112 on the circuit board 110, and the other end of the key matching circuit 320 is electrically connected with the key circuit 125; and one end of the induction matching circuit 330 is electrically connected with the metal conductor 114 on the circuit board 110, and the other end of the induction matching circuit 330 is electrically connected with the induction circuit 135.

In some embodiments, the key matching circuit 320 frequency shifts or filters out the resonant mode generated by the circuit board 110 when at least one of the key 151, 152 or 153 is operated. In some embodiments, the objective is achieved by a π-shaped filter circuit, and any circuit is configured to reduce the impact of at least one of the key 151, 152 or 153 on the antenna efficiency of the antenna module 270 is within the protection scope of the disclosure.

In some embodiments, when the induction circuit 135 senses that a conductive object or a partially conductive object approaches, the induction circuit 135 generates a control signal and transmits the control signal to the antenna module 270 to adjust the amplitude of the power of the antenna module 270, thereby achieving the function of reducing the specific absorption rate (SAR) of the human body.

In some embodiments, the induction matching circuit 330 reduces the impact of the induction circuit 135 on the antenna module 270.

In some embodiments, the antenna module 270 comprises an antenna unit 410, a first antenna matching circuit 220 and a signal source 240, wherein one end of the first antenna matching circuit 220 is electrically connected to the antenna unit 410, the other end of the first antenna matching circuit 220 is electrically connected with the signal source 240, and the antenna module 270 is coupled with the circuit board 110. In the embodiment as shown in FIG. 4, the antenna module 270 comprises a first antenna matching circuit 220, and the circuit 260 comprises a second antenna matching circuit 230. In other words, the wireless communication device 200 comprises the second antenna matching circuit 230 electrically connected with the metal conductor 114 on the circuit board 110, or comprises the first antenna matching circuit 220 electrically connected with the antenna unit 410, or simultaneously comprises both the second antenna matching circuit 230 and the first antenna matching circuit 220.

In some embodiments, the signal source 240 generates an electric signal and transmits the electric signal to the first antenna matching circuit 220.

In some embodiments, the first antenna matching circuit 220 selects a proper filter to calibrate the operation frequency of the electric signal from the signal source 240, thereby optimizing the efficiency of the antenna module 270.

In some embodiments, the antenna unit 410 is coupled with the metal conductor 114 on the circuit board 110 so as to receive or transmit a wireless signal according to the operation frequency calibrated by the first antenna matching circuit 220 or the second antenna matching circuit 230, thereby generating a corresponding radiation pattern. However, the relative positions among the antenna unit 410 and the keys 151, 152, 153 are exemplary references, and the actual arrangement position of the antenna unit 410 is adjusted according to at least one of the frequency band, the efficiency or the isolation degree of operation.

In some embodiments, the first antenna matching circuit 220 and the second antenna matching circuit 230 are achieved by various inductance-capacitance circuits (LC circuits) (such as a circuit 221, a circuit 222, a circuit 223 and a circuit 224 as shown in FIG. 5A, FIG. 5B, FIG. 5C and FIG. 5D), and the frequency band of the operation frequency of the antenna unit 410 is adjusted through a proper design.

Referring to FIG. 5A, FIG. 5B, FIG. 5C and FIG. 5D, the circuit 221 is a low-pass filter which comprises an inductor L1 and a capacitor C1, wherein the first end of the inductor L1 is electrically connected with the signal source 240, the first end of the capacitor C1 is electrically connected with the second end of the inductor L1 and the antenna unit 410, and the second end of the capacitor C1 is grounded; the circuit 222 is a high-pass filter which comprises an inductor L2 and a capacitor C2, wherein the first end of the inductor L2 is electrically connected with the antenna unit 410 and the first end of the capacitor C2, and the second end of the capacitor C2 is electrically connected with the signal source 240; the circuit 223 is a band-pass filter which comprises an inductor L3 and a capacitor C3, wherein the antenna unit 410 is electrically connected with the first end of the inductor L3, the first end of the capacitor C3 and the signal source 240, and the second end of the capacitor C3 and the second end of the inductor L3 are respectively grounded; and the circuit 224 is a band-stop filter which comprises an inductor L4 and a capacitor C4, wherein the antenna unit 410 is electrically connected with the first end of the inductor L4 and the first end of the capacitor C4, and the second end of the inductor L4 and the second end of the capacitor C4 are electrically connected with the signal source 240.

As shown in FIG. 6, in some embodiments, the wireless communication device comprises keys 151, 152, 153, a circuit board 110, a circuit 160 and an antenna module 270, wherein the functions of the keys 151, 152, 153, the circuit board 110 and the circuit 160 are identical to that in FIG. 4 and are not described herein.

In some embodiments, the antenna module 270 comprises an antenna unit 610, a first antenna matching circuit 220 and a signal source 240. As shown in FIG. 6, the antenna module 270 is electrically connected to the circuit board 110 to jointly form an antenna, such as a planar inverted F antenna (PIFA), wherein the antenna unit 610 and the metal conductor 114 on the circuit board 110 are jointly taken as a radiation part of the PIFA and are grounded through the second antenna matching circuit 230. However, the relative positions among the antenna unit 610 and the keys 151, 152 and 153 are exemplary reference, and the actual arrangement position of the antenna unit 610 is adjusted according to the frequency band, the efficiency and the isolation degree of operation.

As shown in FIG. 7, in some embodiments, the wireless communication device comprises keys 151, 152, 153, a circuit board 110, a circuit 160 and an antenna module 270, wherein the functions of the keys 151, 152, 153, the circuit board 110 and the circuit 160 are identical to that in FIG. 4 and are not described herein.

In some embodiments, the antenna module 270 comprises an antenna unit 710, a first antenna matching circuit 220 and a signal source 240. As shown in FIG. 7, the antenna module 270 is electrically connected to the circuit board 110 to jointly form an antenna, such as a loop antenna, wherein the antenna unit 710 and the metal conductor 114 on the circuit board 110 are jointly taken as a radiation part of the loop antenna and are grounded through the second antenna matching circuit 230. However, the relative positions among the antenna unit 710 and the keys 151, 152, 153 are exemplary references, and the actual arrangement position of the antenna unit 710 is adjusted according to the frequency band, the efficiency and the isolation degree of operation.

In some embodiments, the antenna unit 410 in FIG. 4, the antenna unit 610 in FIG. 6 and the antenna unit 710 in FIG. 7 are operated on networks of various frequency bands, such as Long Term Evolution (LTE), Worldwide Interoperability for Microwave Access (WiMaX), Wi-Fi and Global System for Mobile Communications (GSM), and any frequency band suitable for wireless communication is within the protection scope of the disclosure.

In some embodiments, the antenna module 270 involved in FIG. 4, FIG. 6 and FIG. 7 also comprises an exchanger (not shown) which is electrically connected between the first antenna matching circuit 220 and the antenna unit 410, 610, 710. And, the exchanger switches the center frequency when the wireless communication device 200 is positioned in a narrower bandwidth environment and selects a proper circuit 221, 222, 223, 224 to increase the transmission efficiency of the antenna module 270. In some embodiments, the exchanger (not shown) is achieved by a switch or a tuner, and any circuit capable of switching the frequency is within the protection scope of the disclosure.

Figure 8:
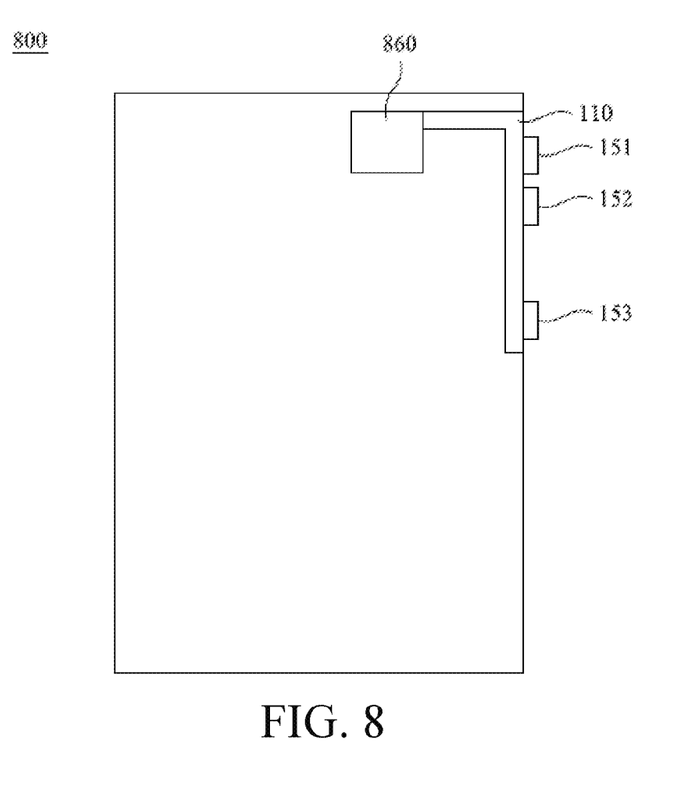
FIG. 8 is a schematic diagram of a wireless communication device according to an embodiment of the disclosure.

FIG. 8 is a schematic diagram of a wireless communication device 800 according to an embodiment of the disclosure. As shown in FIG. 8, the wireless communication device 800 comprises keys 151, 152, 153, a circuit board 110 and a circuit 860, wherein the functions of the keys 151, 152, 153 are identical to the functions of the components with the same numbers in the wireless communication device 100 as shown in FIG. 3 and are not described herein, the circuit 860 is configured as shown in FIG. 9 and FIG. 10, and FIG. 9 and FIG. 10 are taken as examples for detailed description.

Figure 9:
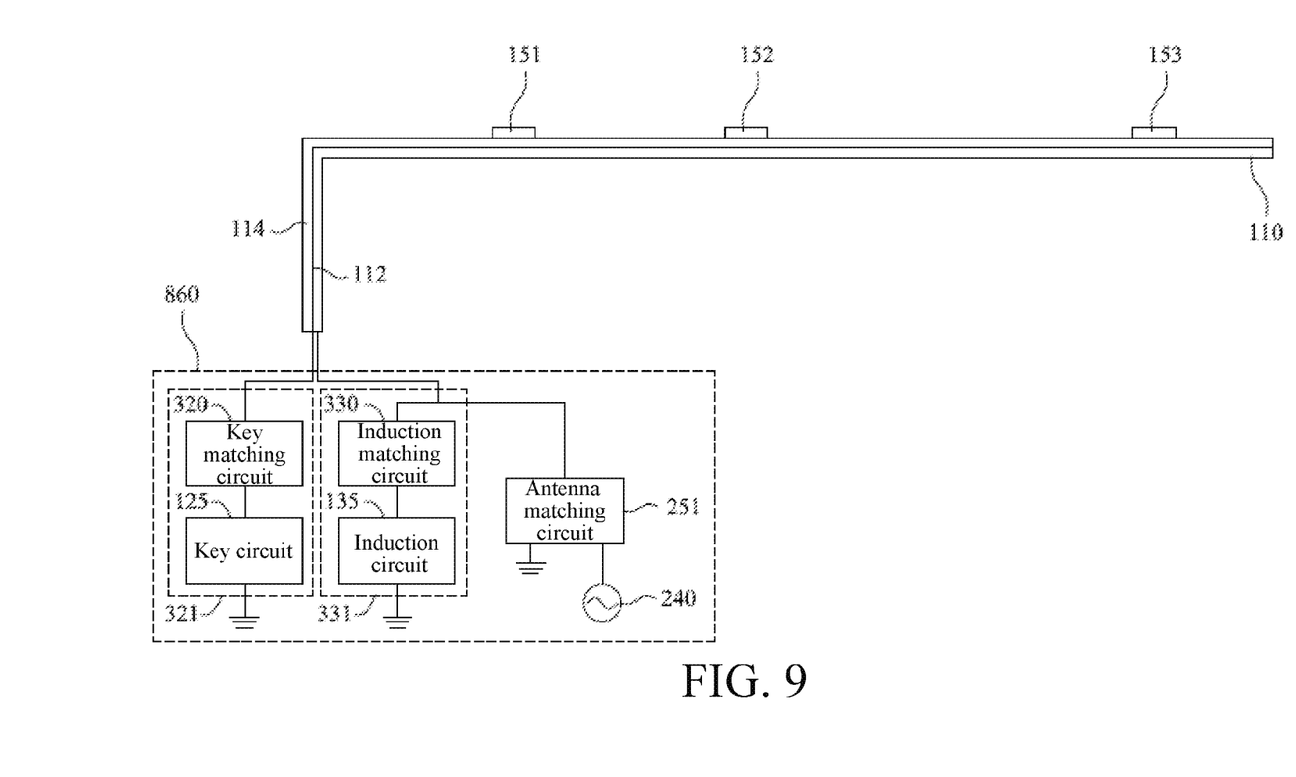
FIG. 9 is a schematic diagram of the edge of the wireless communication device in FIG. 8 according to the embodiment of the disclosure.
Figure 10:
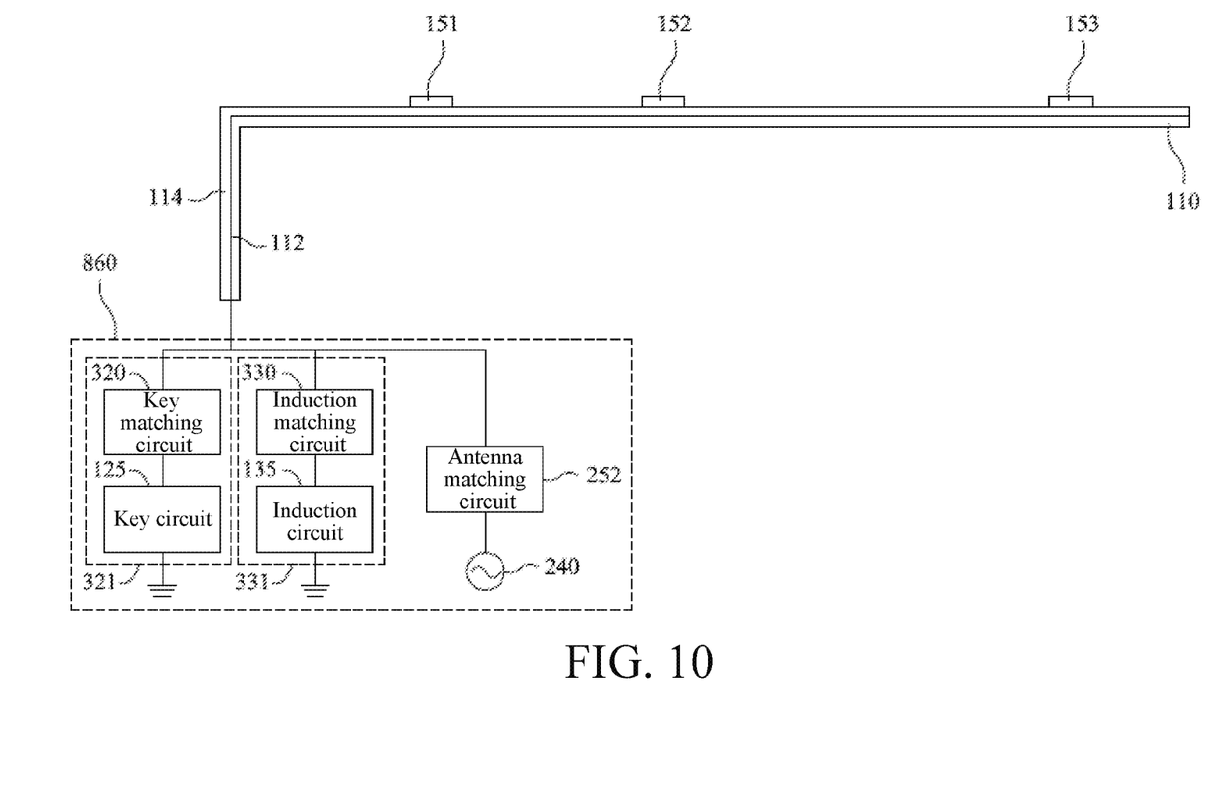
FIG. 10 is a schematic diagram of the edge of the wireless communication device in FIG. 8 according to the embodiment of the disclosure.

FIG. 9 is a schematic diagram of the edge of the wireless communication device 800 in FIG. 8 according to the embodiment of the disclosure. As shown in FIG. 9, in some embodiments, the circuit 860 comprises a key module 321, an sensing module 331, an antenna matching circuit 251 and a signal source 240, wherein the key module 321 is electrically connected with a routing 112 on the circuit board 110, the sensing module 331 is electrically connected with a metal conductor 114 on the circuit board 110, and the signal source 240 is electrically connected with the metal conductor 114 on the circuit board 110 through the antenna matching circuit 251.

In detail, in some embodiments, the routing 112 on the circuit board 110 is taken as a signal transmission channel of the key module 321, the metal conductor 114 on the circuit board 110 is taken as an induction conductor of the sensing module 331 and a radiation part of an antenna, and the antenna is grounded through the antenna matching circuit 251, wherein the antenna is an equivalent antenna cooperatively operated by the circuit board 110, the antenna matching circuit 251, the signal source 240 and the ground terminal.

In some embodiments, one end of the antenna matching circuit 251 is electrically connected with the metal conductor 114 on the circuit board 110, and the other end of the antenna matching circuit 251 is electrically connected with the signal source 240 and is grounded. In this embodiment, the antenna is cooperatively operated by the circuit board 110, the antenna matching circuit 251, the signal source 240 and the ground terminal to generate a wireless signal corresponding to an electric signal from the signal source 240. In detail, the circuit board 110 generates a wireless signal corresponding to the resonant frequency according to the resonant frequency corresponding to the electric signal from the signal source 240 and calibrated by the antenna matching circuit 251, and performs wireless communication with a wireless base station according to the wireless signal.

In some embodiments, the antenna matching circuit 251 is achieved by integrating two matching circuits to match the frequency from the signal source 240 with the grounded frequency, thereby optimizing the efficiency of the antenna.

In some embodiments, the key module 321 comprises a key matching circuit 320 and a key circuit 125, wherein one end of the key matching circuit 320 is electrically connected with the routing 112 on the circuit board 110, the other end of the key matching circuit 320 is electrically connected with one end of the key circuit 125, and the other end of the key circuit 125 is grounded. The sensing module 331 comprises an induction matching circuit 330 and an induction matching circuit 135, wherein one end of the induction matching circuit 330 is electrically connected with the metal conductor 114 on the circuit board 110, the other end of the induction matching circuit 330 is electrically connected with one end of the induction matching circuit 135, and the other end of the induction matching circuit 135 is grounded.

In some embodiments, the functions of the key matching circuit 320, the key circuit 125, the induction matching circuit 330 and the induction matching circuit 135 as shown in FIG. 9 are identical to the functions of the components with the same numbers as shown in FIG. 4.

FIG. 10 is a schematic diagram of the edge of the wireless communication device 800 in FIG. 8 according to the embodiment of the disclosure. As shown in FIG. 10, in some embodiments, the circuit 860 comprises a key module 321, a sensing module 331, an antenna matching circuit 252 and a signal source 240, wherein the key module 321 and the sensing module 331 are electrically connected with the routing 112 on the circuit board 110 respectively, and the signal source 240 is electrically connected with the routing 112 on the circuit board 110 through the antenna matching circuit 252.

In detail, in some embodiments, because the routing 112 on the circuit board 110 is made of metal, the routing 112 on the circuit board 110 is simultaneously taken as a signal transmission channel of the key module 321, an induction conductor of the sensing module 331 and a radiation part of the antenna.

In some embodiments, one end of the antenna matching circuit 252 is electrically connected with the routing 112 on the circuit board 110, and the other end of the antenna matching circuit 252 is electrically connected to the signal source 240. In this embodiment, the antenna is an equivalent antenna cooperatively operated by the circuit board 110, the antenna matching circuit 252 and the signal source 240, to generate a wireless signal corresponding to an electric signal from the signal source 240. In detail, the circuit board 110 generates a wireless signal according to the resonant frequency corresponding to the electric signal from the signal source 240 and calibrated by the antenna matching circuit 252, and performs wireless communication with a wireless base station according to the wireless signal.

In some embodiments, the key module 321 comprises a key matching circuit 320 and a key circuit 125, wherein one end of the key matching circuit 320 is electrically connected with the routing 112 on the circuit board 110, the other end of the key matching circuit 320 is electrically connected with one end of the key circuit 125, and the other end of the key circuit 125 is grounded. The sensing module 331 comprises an induction matching circuit 330 and an induction matching circuit 135, wherein one end of the induction matching circuit 330 is electrically connected with the routing 112 on the circuit board 110, the other end of the induction matching circuit 330 is electrically connected to one end of the induction matching circuit 135, and the other end of the induction matching circuit 135 is grounded.

In some embodiments, the functions of the key circuit 125, the induction matching circuit 330, the induction matching circuit 135, the first antenna matching circuit 220 and the second antenna matching circuit 230 are identical to the functions of the components with the same numbers as shown in FIG. 4. In some embodiments, the key matching circuit 320 not only performs frequency shift or filtering out the resonant mode generated by the circuit board 110 when the key 151, 152 or 153 is operated, but also reduce the interference among the signals transmitted by the key module 321, the sensing module 331 and the antenna respectively.

In conclusion, according to the wireless communication device disclosed by the disclosure, the functions of the key module 321, the sensing module 331 and the antenna are integrated on the same component (such as the circuit board 110), so that the component has three-in-one functions, and the efficiency of the antenna is further enhanced.

Although the invention has been described with reference to the above embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:

1. A wireless communication device, comprising:
   a circuit board, which is a flexible print circuit;
   a key module, electrically connected with at least one key through the circuit board; and
   a sensing module, electrically connected with the circuit board, wherein the circuit board is taken as an induction conductor of the sensing module, wherein the sensing module changes the electromagnetic wave power generated by the wireless communication device according to a coupling relationship between the circuit board and a sensed object.

2. The wireless communication device according to claim 1, wherein the key module is electrically connected with a routing on the circuit board, and the sensing module is electrically connected with a metal conductor different from the routing on the circuit board.

3. The wireless communication device according to claim 1, wherein the sensing module changes the electromagnetic wave power generated by the wireless communication device according to a coupling relationship between the circuit board and an sensed object.

4. The wireless communication device according to claim 3, wherein the sensing module comprises:
   an induction matching circuit, electrically connected with the circuit board and is configured to calibrate the variation of a capacitance value between the circuit board and the induced object; and
   an induction circuit electrically connected with the induction matching circuit and is configured to change the radiation power of the wireless communication device according to the calibrated variation of the capacitance value.

5. The wireless communication device according to claim 1, wherein the wireless communication device also comprises:
   an antenna module, coupled to the circuit board.

6. The wireless communication device according to claim 5, wherein the key module is electrically connected with the routing on the circuit board, and the sensing module and the antenna module are electrically connected with a metal conductor different from the routing on the circuit board.

7. The wireless communication device according to claim 5, wherein the antenna module comprises:
   a first antenna matching circuit, configured to calibrate the operation frequency of the antenna module; and
   an antenna unit, electrically connected with the first antenna matching circuit.

8. The wireless communication device according to claim 7, wherein the circuit board comprises a metal conductor, and the metal conductor electrically connects with a second antenna matching circuit.

9. The wireless communication device according to claim 1, wherein the wireless communication device also comprises:
   an antenna matching circuit, wherein one end of the antenna matching circuit is electrically connected with the circuit board, and the other end of the antenna matching circuit is electrically connected with a signal source.

* * * * *